(12) United States Patent
Pentakota et al.

(10) Patent No.: US 6,891,486 B1
(45) Date of Patent: May 10, 2005

(54) CALIBRATING CAPACITOR MISMATCH IN A PIPELINE ADC

(75) Inventors: Visvesvaraya A. Pentakota, Bangalore (IN); Jagannathan Venkataraman, Bangalore (IN); Vineet Mishra, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/722,416

(22) Filed: Nov. 28, 2003

(51) Int. Cl.[7] .............................................. H03M 1/10
(52) U.S. Cl. ..................... 341/120; 341/155; 341/172
(58) Field of Search ............................. 341/120, 143, 341/150, 144, 155, 172

(56) References Cited

U.S. PATENT DOCUMENTS

| | | | |
|---|---|---|---|
| 5,510,789 A | * | 4/1996 | Lee ............................ 341/120 |
| 5,825,316 A | * | 10/1998 | Kuttner ....................... 341/120 |
| 6,169,502 B1 | * | 1/2001 | Johnson et al. ............. 341/120 |
| 6,184,809 B1 | * | 2/2001 | Yu .............................. 341/120 |
| 6,489,914 B1 | * | 12/2002 | Jones et al. ................. 341/162 |

* cited by examiner

*Primary Examiner*—Peguy JeanPierre
(74) *Attorney, Agent, or Firm*—W. Daniel Swayze, Jr.; W. James Brady; Frederick J. Telecky, Jr.

(57) ABSTRACT

An on-chip calibration circuit which can dynamically (i.e., in operational environment) measure the capacitor mismatch in an ADC using sampling capacitors to sample an input signal and a feedback capacitor (in combination with an amplifier) for amplification. The measured values can be used to generate accurate digital codes representing analog signal samples. The calibration circuit connects the capacitors to various voltage levels and measures the mismatch levels by examining various signals (e.g., the digital codes) generated in such situations.

43 Claims, 7 Drawing Sheets

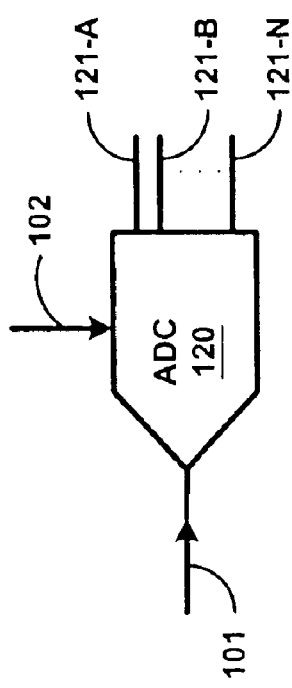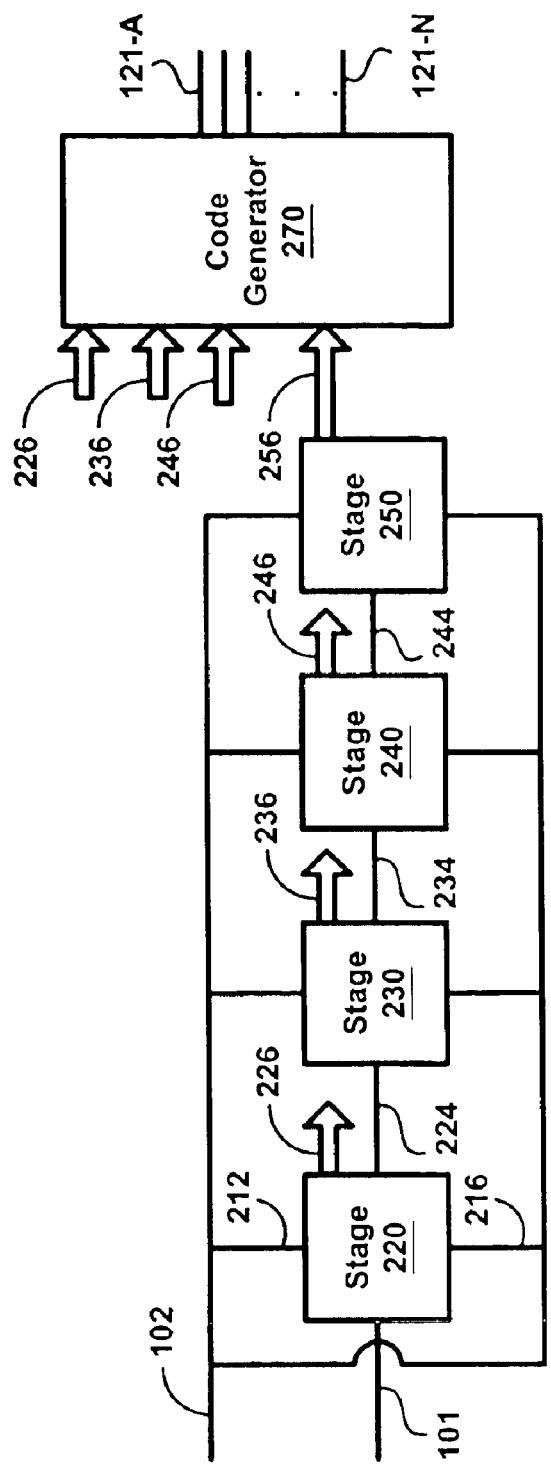

CALIBRATING CAPACITOR MISMATCH IN A PIPELINE ADC

BACKGROUND OF THE INVENTION

1. Field of the Invention

The present invention relates to analog to digital converters (ADC), and more specifically to a method and apparatus for calibrating capacitor mismatch in a pipe-line ADC.

2. Related Art

An analog to digital converter (ADC) generally refers to a component which converts an analog signal to a sequence of digital codes. In general, an ADC samples the analog signal at a time point specified by a clock signal, and generates a corresponding digital code depending on the voltage level of the sampled signal.

Pipeline ADC refers to a type of ADC in which multiple stages are connected sequentially. The output of each stage is provided as an input to the next stage, with the first stage receiving an analog signal as the input. Each stage may be logically viewed as resolving a portion (sub-code) of the digital code sought to be generated by the ADC, and generating an output signal which represents the unresolved portion.

Each stage of a pipeline ADC often contains capacitors (along with the operation of other components) to perform tasks such as sampling an input signal and generating the output signal representing the unresolved portion. For an ideal operation, the capacitance of the capacitors need to be in a desired ratio, but deviate from the desired ratios due to reasons such as imperfections in manufacturing processes and impact of change of operating conditions (e.g., temperature, voltage). Such deviations are generally referred to as a 'Capacitor mismatch'.

One problem with capacitor mismatch is that each stage may not generate the output signal at accurate strength, which in turn leads to incorrect sub-codes being generated by stages down the processing path. Accordingly, it is desirable that the effects of mismatches be countered. One approach for such countering requires calibration of the mismatches. Calibration generally refers to measurement of the level of mismatch. Once the mismatch is calibrated, appropriate corrective action can be taken.

BRIEF DESCRIPTION OF THE DRAWINGS

Various features of the present invention will be described with reference to the following accompanying drawings.

FIG. 1 is a block diagram illustrating the general operation of an analog to digital converter (ADC) in one embodiment.

FIG. 2 is a block diagram illustrating the details of an ADC in one embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

Figure 3:
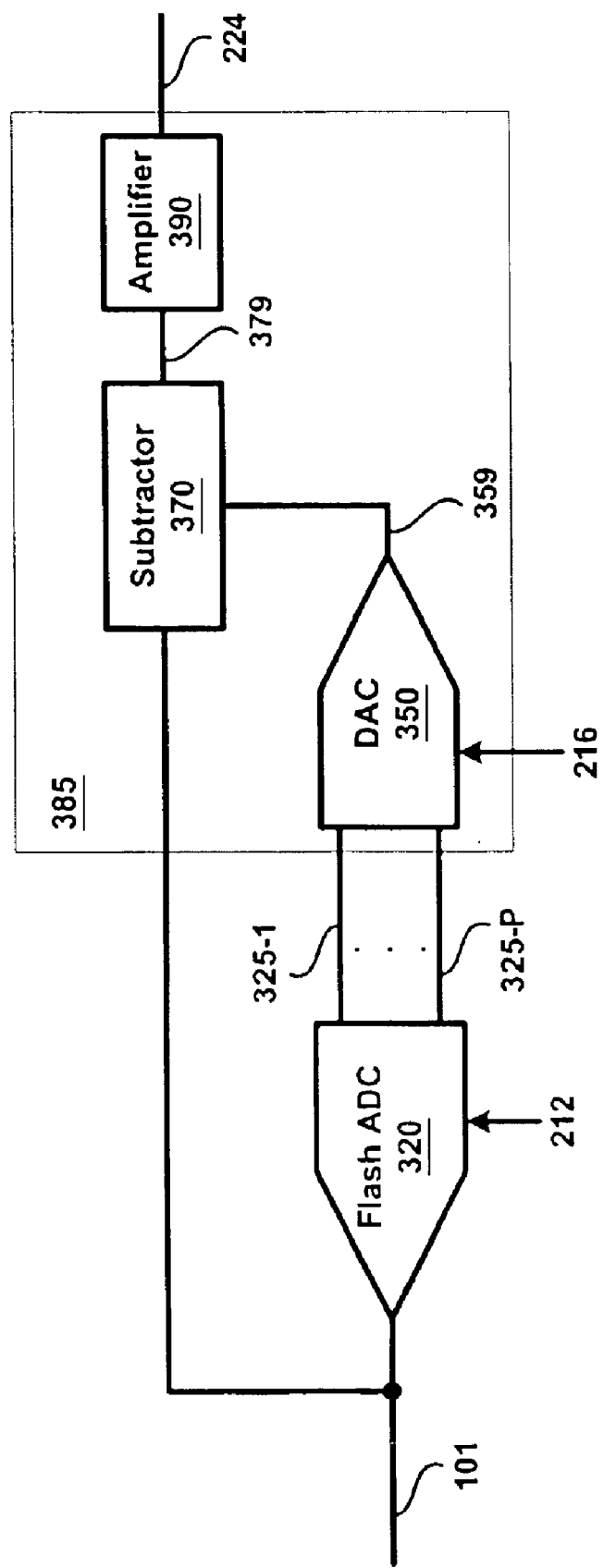
FIG. 3 is a block diagram illustrating the details of a stage of a pipeline ADC in one embodiment.

An aspect of the present invention enables a calibration block to measure capacitor mismatch in an analog to digital converter (ADC). The ADC may contain multiple stages, with each stage containing sampling capacitors, an amplifier, a sub-ADC, a feedback capacitor across the amplifier, and various switches to connect the capacitors to different voltage levels. The calibration block generates a mismatch code (reflecting the extent of capacitor mismatch) associated with each sampling capacitor contained in the ADC.

A calibration block determines the mismatch codes by connecting the capacitors (by closing/opening the switches appropriately) to various voltage levels and examining output signals (before any corrections due to the calibration) generated by the pipeline ADC. At least some of the pre-specified voltages may be otherwise required for converting analog samples to corresponding digital codes. As a result, the calibration block may be implemented with minimal overhead.

In one implementation, the mismatch code corresponding to each input capacitor is determined ignoring any input offset (i.e., assuming input offset=0) present in the amplifiers used in various stages of a pipeline ADC. A 0 voltage (or common mode voltage in case of differential implementations) is sampled onto the capacitors and a reference voltage Vref is sampled onto the feedback capacitor in a sampling phase ($\phi1$). Voltages such as ground voltage or common mode voltage are referred to as constant bias voltages.

In the hold phase ($\phi2$), a specific one(s) of the input capacitors sought to be calibrated is connected to another voltage (e.g., reference voltage $Vref_i$ which determines the range of ADC) and the remaining input capacitors to ground (or common mode voltage in the case of differential applications). The capacitor mismatch of the specific capacitor can be computed based on digital code received from the output of the ADC.

The capacitor mismatch is determined based on a recognition that a stage of an pipeline ADC operates as an amplifier (while introducing negligible error) when the sub-code generated is zero. Thus, by providing a small voltage (0 or common mode voltage in the illustrative embodiments) as an input, the code generated may represent the capacitor mismatch multiplied by the gain of the stages. As noted above, the capacitor mismatch is determined assuming that each the input offset in each stage equals zero.

In an alternative implementation, the mismatch code for each input capacitor is determined taking into account the input offset present in the amplifiers used in various stages of a pipeline ADC. Broadly, an offset code (or level) representing the amplification caused due to non-zero input offsets is measured in one clock cycle (containing $\phi1$ and $\phi2$), and aggregate code (or level) caused due to both the input offsets and the capacitor mismatch of a specific capacitor is measured in another clock cycle. The mismatch code (level) is computed by subtracting the offset code/level from the aggregate code/level.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. ADC

FIG. 1 is a block diagram illustrating the operation of an example ADC in which various aspects of the present invention can be implemented. ADC 120 receives an input signal on path 101 and generates a digital code proportionate to the voltage level of a sample of the input signal. The bits of the digital code are provided on bit lines 121-A through 121-N respectively.

The specific value of the digital code depends on the reference voltage (received on path 102), and generally equals (Vi*2**N)/Vref, wherein N represents the number of bits in the digital code, * represents the multiplication operation, ** represents 'power of' operation, Vi represents the voltage of the sample, Vref the reference voltage and '/' the division operation. ADC 120 may be implemented as multiple stages, as described below with reference to FIG. 2.

FIG. 2 is a block diagram illustrating the details of ADC 120 in one embodiment. For illustration, pipeline ADC 120 is shown containing four stages 220, 230, 240 and 250, and code generator 270. However, more stages can be used within an ADC. In such situations, stage 250 may be viewed as logically containing such additional stages in the description below.

Each stage (220, 230, 240, and 250) uses reference voltage (Vref 102) to generate a P-bit sub-code corresponding to a voltage level of an analog signal received as a corresponding input. For example, stage 230 coverts a voltage level on path 224 to generate a P-bit sub-code on path 246.

Code generator 270 generates the N-bit (corresponding to the voltage level on path 101) code based on the sub-codes generated by stages 220, 230, 240, 250 and 260. In an embodiment, each P-bit code contains an 'additional bit' for error correction. In general, the extra bit has a weight of half of the least significant bit of the remaining P−1 bits (and equals the weight of the most significant bit of the next stage). The description is continued with reference to details of (first) stage 220 of ADC 120.

FIG. 3 is a block diagram providing a logical view of the details of stage 220 of ADC 120 in one embodiment. The description is provided with reference to stage 220 merely for illustration, however, stages 230, 240 and 250 may also be implemented in a similar manner. Stage 220 is shown containing flash ADC 320, DAC 350, subtractor 370, and amplifier 390. Each block is described in detail below.

Flash ADC 320 (an example of a sub-ADC) converts a sample of the analog signal received on path 101 into a corresponding P-bit sub-code using reference voltage 212. The P-bit sub-code is provided on paths 325-1 through 325-P (contained in path 226 of FIG. 2, and P is less than N). Flash ADC 320 may be implemented is a known way.

DAC 350 converts the sub-code received on paths 325-1 through 325-P into corresponding analog signal (Vdac) and provides the output on path 359 using another reference voltage on path 216. The reference voltages 212 and 216 are derived from a common reference signal 102.

Subtractor 370 generates the difference of the analog signal 101 (Vin) and the analog signal received on path 359 (Vdac). The difference voltage (Vin-Vdac) is provided on path 379. Amplifier 390 amplifies the difference voltage with a gain of $2^P$, wherein P represents the number of bits in the sub-code generated by stage 220. The amplified signal ((Vin−Vdac)×Gain) is provided as an input to stage 230 on path 224.

DAC 350 and subtractor 370 may be implemented as a combination of capacitors and switches as described below with reference to FIG. 4.

3. Implementation Using Capacitors

Figure 4:
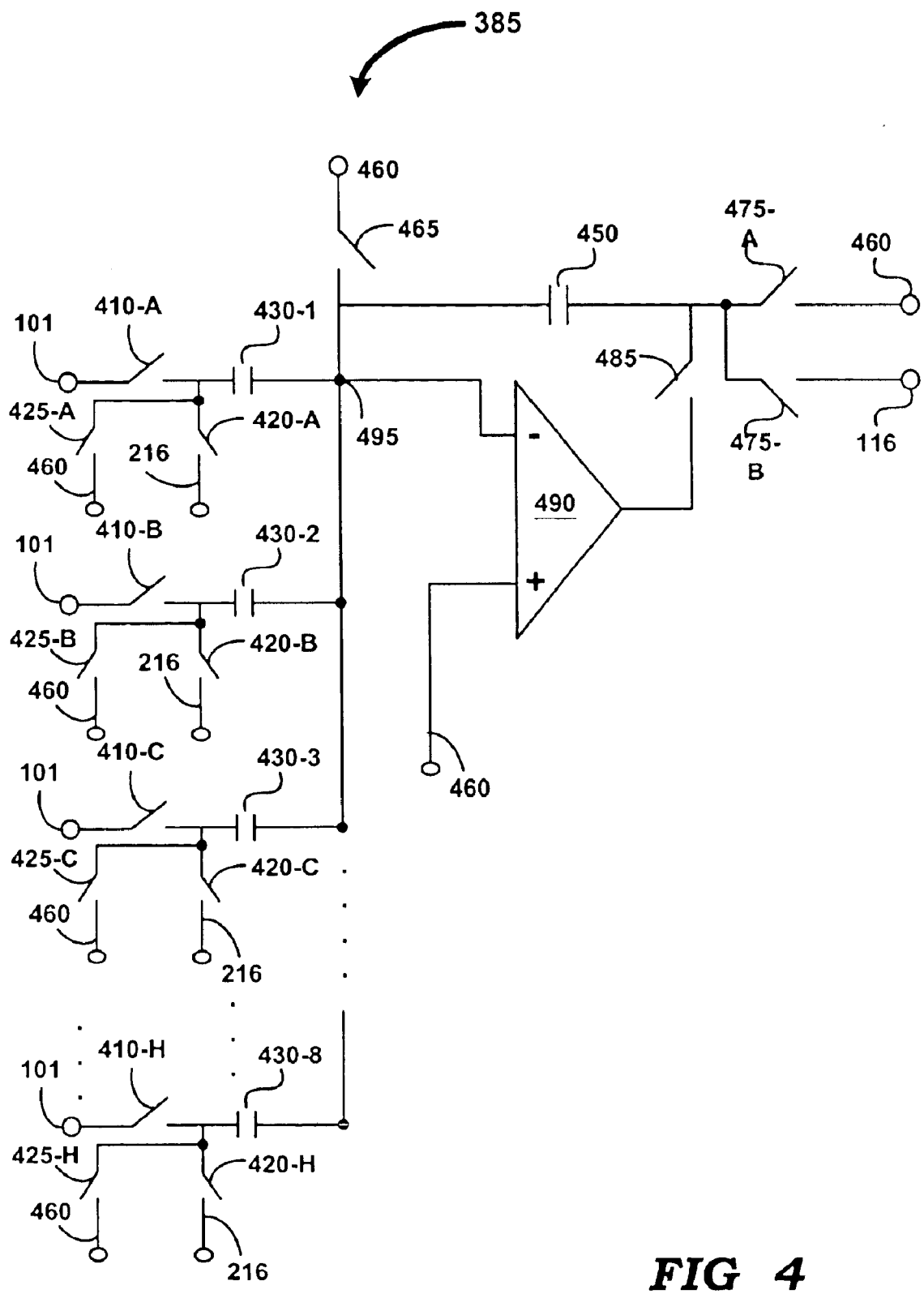
FIG. 4 is a circuit diagram illustrating the details of a portion of a stage of an ADC in one embodiment.

FIG. 4 is a circuit diagram illustrating the manner in which DAC 350, subtractor 370 and amplifier 390 together may be implemented using capacitors in one embodiment. Circuit 385 is shown containing input capacitors 430-1 through 430-8, feedback capacitor 450, switches 410-A through 410-H, 420-A through 420-H, 465, 475-A and 475-B and 485, and operational amplifier 490. Operational amplifier 490 is shown connected as a single ended amplifier for conciseness. However, operational amplifier 490 may be operated in differential mode as well. The operation of the circuit diagram of FIG. 4 is described below.

For illustration, it is assumed that stage 220 is implemented to provide P(=3) bit sub-code. Circuit 385 is implemented using ($2^P=2^3 8$) eight input capacitors 430-1 through 430-8. Inverting terminal (−) of operational amplifier 490 is shown connected to node 495, and non-inverting terminal ((+)) is connected to common mode voltage 460. Node 495 may be connected to common mode signal 460 by operating (closing) 465. Node 495 is shown connected to eight input capacitors 430-1 through 430-8, feedback capacitor 450 and switch 465.

Input capacitor 430-1 may be connected to Vin (by closing switch 410-A), to Vref (on path 216 by closing 420-A) or to common mode voltage (by closing switch 425-A). The other input capacitors may also be similarly connected by closing the corresponding switches. In general, each switch is closed to provide the connection, and opened to leave the corresponding path in a disconnected state.

Feedback capacitor 450 is shown connected to node 495 at one end. The same end may be connected to common mode signal 460 by closing switch 465. The other end of feedback capacitor 450 may be connected to each of Vref 216, common mode signal 460 and output terminal of operational amplifier 490 by closing respective switches 475-B, 475-A, and 485.

Operational amplifier 490 generates the amplified signal ((Vin−Vdac)×Gain), as desired, by appropriate operation of various switches as described below in further detail.

Broadly, the input signal Vin received on path 101 is sampled onto input capacitors 430-1 through in one phase (φ1 or sample Phase) of a clock signal, and the subtraction (i.e., Vin−Vdac) and amplification are performed in the other phase (φ2 or hold phase). The details of operation in the two phases are described below in further detail.

In φ1('sample phase'), 410-A through 410-H, 465 and 475-A are closed (remaining switches are open). Thus, switches 410-A through 410-H respectively connect input capacitors 430-1 through 430-8 to Vin at one end, and switch 465 connects the other end of the input capacitors to to common mode signal 460 (via node 495). As a result, each of input capacitors 430-1 through 430-8 samples voltage level of Vin (on path 101) during φ1. Both ends of feedback capacitor 450 are connected to common mode signal 460 (via node 495 and via switch 475-A), which discharges/resets the feedback capacitor.

In φ2 ('hold phase'), a number of input capacitors equaling the value of the sub-code are connected to Vref by closing the corresponding switches 420-A through 420-H, and the remaining input capacitors are connected to common mode voltage by closing the corresponding switches 425-A through 425-H. For example, if the sub-code equals a value of 3, switches 425-A through 425-C and 420-D through 420-H may be closed, and the remaining switches may be kept open. As a result, the voltage at node 495 ideally equals (Vin−Vdac).

In the hold phase, switch 485 is also closed, which causes amplifier 490 to amplify the voltage at node 495 by a factor equaling 8, assuming that all of the capacitors 430-1 through 430-8 and 450 have equal capacitance C. However, the capacitance of each capacitor may not precisely equal C, and accordingly there is a capacitor mismatch. Mismatch generally refers to the deviation of the ratio of the capacitance of an input capacitor and a feedback capacitor from a desired ratio (in the present case, a value of 1).

An aspect of the present invention estimates the capacitor mismatch for each of the capacitors, and corrective action may be taken accordingly. The theoretical background for estimating the capacitor mismatch is provided below. First, a broad overview of the theoretical background is provided, and the details are described then.

4. Broad Overview of Theoretical Background

For ease of understanding, first, the manner in which the effective capacitor mismatch can be measured is described assuming that the amplifiers (e.g., 450 of FIG. 4) in each stage have a corresponding input offset of 0. As is well known, for an ideal amplifier, the voltage across the input terminals equals 0, but for practical amplifiers the voltage is not zero, and is referred to as input offset. The input offset, along with the input voltage, may be amplified by the amplifier.

The description is then continued with reference to the manner in which the capacitor mismatch can be measured when each amplifier has a non-zero input offset.

It should be further understood that the description is provided with reference to determining the capacitor mismatch for the capacitors in first stage 220 only merely for illustration. However, the concepts can be extended to other stages as well, as will be apparent to one skilled in the relevant arts by reading the disclosure provided herein. In addition, the subsequent stages may be generally operated according to the approaches (well known in the relevant arts) described above with reference to FIG. 4, and only the differences from such approaches are described below for conciseness.

5. Estimating ε Values Assuming an Ideal Amplifier

In the description below, the capacitance of feedback capacitor 450 is represented by Cf. The capacitance values of capacitors 430-1 through 430-8 are respectively represented by C1 through C8 (or Ci in general). In addition, due to the mismatch, the capacitances C1 through C8 are viewed as equaling:

$$Ci = Cf(1+\epsilon i) \qquad \text{Equation (1)}$$

wherein i is an integer taking on values 1 to 8, εi provides a measure of the capacitor mismatch for the corresponding input capacitance. Thus, when there is no mismatch, εi equals 0 for the corresponding capacitor.

First, a general analysis, illustrating the manner in which the capacitor mismatches affect the output voltage, is provided. Based on that analysis, the manner in which each value of εi may be measured is described in the case of ideal amplifiers.

In φ1, input capacitors C1 through C8 would sample an input voltage Vin (by respectively operating 430-1 through 430-8). Assuming that C1 through C8 are all connected to Vref in φ2 (corresponding to a Vdac output of ($2^8-1$)), the voltage at node 495 equals (Vin−Vref). If C1 through C8 are equal in value (C), the output voltage Vout at the output terminal of operational amplifier 490 (in φ2) is shown in Equation (2).

$$Vout = 8(C/Cf) \times Vin - 8(C/Cf) \times Vref \qquad \text{Equation (2)}$$

wherein 'x','/', and '-' respectively represent multiplication, division and subtraction operator.

If there is no mismatch, C=Cf, and Equation (1) reduces to:

$$Vout = 8Vin - 8Vref \qquad \text{Equation (3)}$$

Now, assuming that only M capacitors (out of 8 input capacitors, C1 through C8) are connected to Vref and remaining (8−M) capacitors ae connected to common mode voltage in φ2, Vout is as shown in Equation (4) (by substituting the above condition) below.

$$Vout = 8(C/Cf) \times Vin - M(C/Cf) \times Vref - 0 \times (8-M)(C/Cf) \quad Vout = (C/Cf) \times Vin - M(C/Cf) \times Vref \qquad \text{Equation (4)}$$

If C is equal to Cf, (by substituting C=Cf in Equation (4)), Vout is as shown in Equation (5) below.

$$Vout = 8 \times Vin - M \times Vref \qquad \text{Equation (5)}$$

If there is a capacitor mismatch (i.e., C is not equal to Cf; but instead if C is equal to Cf(1+ε)), Vout is as shown in Equation (6) (by substituting C=Cf(1+ε) in Equation (4)) below.

$$Vout = 8 \ ((1+\epsilon) \times Vin) - M((1+\epsilon) \times Vref) \qquad \text{Equation (6)}$$

wherein ε, equals each of εi (i=1 to 8), and '+' represents addition operator.

To measure ε, the input voltage (Vin) to the first stage 220 provided on path 101 may be set to a constant bias voltage of 0 or common mode voltage (depending on the mode of operation), in which case the output of stage 220 is represented by Equation (6) (by substituting (Vin=0) in Equation (6).

$$Vout = -M \times Vref \ (1+\epsilon) \qquad \text{Equation (7)}$$

If input capacitors C1 through C8 are not equal in value, but according to Equation (1) noted above, the output Vout of stage 220 equals:

$$Vout = (\epsilon 1 + \epsilon 2 + \ldots + \epsilon M) Vref \qquad \text{Equation (8)}$$

Assuming that the output Vout of Equations (7) and (8) is lower than the resolution offered due to the first few stages, the DACs in the few stages generate sub-codes of 0 and continue to amplify the Vout. The remaining stages would generate a digital code (Dout) representing the amplified output.

Thus, with reference to FIG. 2, stages 230 and 240 would merely amplify the input signal Vin, and not introduce any errors due to capacitor mismatch. Stage 250 may generate a non-zero sub-code, and error may be introduced due to capacitor mismatch in that stage. However, the error introduced by stage 250 is lesser than the resolution of calibration.

Assuming for illustration that stages 230, 240 and 250 amplify Vout (and generate corresponding sub-codes of 0)

with respective amplification factors of A1, A2 and A3, the theoretical voltage level on path 254 sampled by stage 250 is given by (since the capacitor mismatch in the later stages 230, 240 and 250 does not affect the signal processing):

Theoretical Sampled Voltage=$Vout \times A1 \times A2 \times A3$   Equation (9)

Substituting Equation (8) in Equation (9):

Theoretical Sampled Voltage=$(\epsilon1+\epsilon2+\ldots+\epsilon M) \times Vref \times A1 \times A2 \times A3$   Equation (10)

Based on Dout, the actual sampled voltage equals:

Actual Sampled Voltage=$Dout \times Vref/2^N$   Equation (11)

wherein N represents the number of bits contained in the total code generated by ADC 120.

Equating the theoretical sampled voltage with the actual sampled voltage from Equations (10) and (1), we obtain:

$(\epsilon1+\epsilon2+\ldots+\epsilon M) \times Vref \times A1 \times A2 \times A3 = Dout \times Vref/2^N$   Equation (12)

$(\epsilon1+\epsilon2+\ldots+\epsilon M) = (Dout \times Vref/2^N)/(Vref \times A1 \times A2 \times A3)$. Equation (13)

Thus, Vin may be to equal 0, selectively connect only one or more input capacitors to Vref in φ2, and determine the sum of the corresponding ϵi values according to Equation (13) provided below. The ϵi value corresponding to each individual input capacitor may be accordingly determined. Appropriate corrective action may be taken once the ϵi values are determined.

The analysis of above is provided under the assumption that the input offset for the amplifier in each stage equals 0. However, in practical implementations, the input offset is not equal to zero. The description is continued with reference to the manner in which the capacitor mismatch can be measured when each amplifier has a non-zero input offset.

6. Measuring Capacitor mismatch in Case of Non-Zero Input Offset

As described below, the measurement of capacitor mismatch entails two separate tasks—(1) to measure a signal that would be generated due to a combination of the non-zero input offsets and the amplification in the stages; and (2) to measure a signal due to a combination of non-zero input offset, capacitor mismatch (for each capacitor), and the amplification in the stages. The result of measurement of task (1) is referred to as an 'offset code', and the result of measurement of task (2) is referred to as 'aggregate code'.

The capacitor mismatch alone can be measured by subtracting offset code from the aggregate code as will be clear from the equations used the characterize the two codes.

7. Offset Code

To determine the offset code, in φ1, the input voltage on path 101 is set to zero, and switches 410-A through 410-H, 465 and 475-A are closed (and the remaining switches opened). As a result, input capacitors 430-1 through 430-8 (of stage 220) sample the input voltage of 0 and feedback capacitor 450 is reset to zero. In phase φ2, switches 410-A through 410-H, and 485 (of stage 220) are closed causing the voltage at node 495 to be amplified, and provided as an output of amplifier 490.

The resulting digital code generated by code generator 270 or the input signal to last stage 250 represents the offset code/level. Equations characterizing the value of the offset code/level are provided below. The output of each stage is analyzed for the characterization.

With respect to the operation of stage 220, the output (Vout220) would merely contain the input offset (Voffset220) amplified by the gain (G220) of operational amplifier 490.

$Voc\_out220 = G220 \times Voffset\,220$   Equation (14)

The output of stage 220 is provided as input to stage 230. The voltage Vout220 may be large enough to cause stage 230 (or flash ADC) to generate a non-zero sub-code. Representing the voltage equivalent (generated by DAC) of the sub-code by Vdac230, the output (Vout230) of stage 230 is given by:

$Voc\_out230 = G230(Voc\_out220 - Vdac230 + Voffset230)$   Equation (15)

wherein G230 represents the gain of stage 220 and Voffset230 represents the input offset of the amplifier within stage 230.

Similarly, the output of stage 240 is given by:

$Voc\_out240 = G240\,(Voc\_out230 - Vdac240 + Voffset240)$   Equation (16)

wherein G240 represents the gain of stage 240 and Voffset240 represents the input offset of the amplifier within stage 240.

Thus, the sub-code generated by stage 250 corresponds to voltage Voc_out240. Substituting equation 14 into 15, and then 15 into 16, we obtain:

$$Voc\_out240 = G240( \qquad \text{Equation (17)}$$
$$(G230(G220 \times Voffset220 - Vdac230 + Voffset230)) - $$
$$Vdac240 + Voffset240)$$

$$= [(G240 \times G230 \times G220 \times Voffset220) + \qquad \text{Equation (18)}$$
$$(G240 \times G230 \times Voffset230) + (G240 \times Voffest240)] - $$
$$G240 \times component1 - G240 \times component2$$

wherein component1=G230×Vdac230, and component2= Vdac240.

The digital-code generated by code generator 270 represents the offset code and the signal level on path 244 represents the offset level. It is further helpful to understand that the offset code may be generated only once for all the input capacitors. The description is provided with reference to determining the aggregate code/level.

7. Aggregate Code/Level

It is helpful to first note that the aggregate code may be determined with respect to each input capacitor. In addition, the input signals are processed assuming that sub-codes generated by at least some intermediate stages (e.g., second and third stages 230/240) in the aggregate code generation task to be equal to the corresponding sub-codes generated in the offset code generation task. As a result, the (any) errors (such as capacitor mismatches) in the capacitors of such intermediate stages do not affect the computation of the aggregate code/level. Stage 250 (or multiple stages logically contained therein) may perform normal conversion (without forcing of sub-code to the value generated in the offset code generation phase).

To determine the aggregate code, in φ1, the input voltage on path 101 is set to zero, and switches 410-A through 410-H and 475-D are closed (and the remaining switches opened). As a result, input capacitors 430-1 through 430-8 sample the input voltage of 0/CM and feedback capacitor 450 charges to Vref. In phase φ2, switch 485 and the specific one of switches 420-A through 420-H corresponding to the input capacitor (of the first stage) being calibrated are closed. The remaining input capacitors are connected to CM by closing the corresponding switches 460-A through 460-H. Closing switch 485 causes the voltage at node 495 to be amplified, and provided as an output of amplifier 490.

In addition, as noted above, intermediate stages 230 and 240 are operated assuming (forcing the value) the same value of sub-code is generated as in the offset code generation phase. In other words, the value generated by the corresponding VDAC is ignored and the subtraction operation is performed using the sub-code generated in the off-set code generation phase. As a result, any errors due to capacitor mismatch in such intermediate stages would be introduced in both offset code generation task and the aggregate code generation task, and the subtraction operation described below cancels both the errors.

The resulting digital code generated by code generator 270 and the voltage provided to last stage 250 respectively represent the aggregate code and aggregate level as described below.

For illustration, the aggregate code/level generated due to mismatch of input capacitor 430-1 as compared to feedback capacitor 450 is described. With respect to the operation of stage 220, the output (Vout220) would contain mismatch error voltage (Vref×ε1) and the input offset (Voffset220) amplified by the gain (G220) of operational amplifier 490. The output voltage of stage 220 is as shown in Equation (19) below (as may be inferred based on Equation (7) noted above).

$$Vac\_out220 = Vref \times \epsilon 1 + Voffset220 \times G220 \qquad \text{Equation (19)}$$

The output of stage 220 is provided as input to stage 230. As noted above, since the sub-code generated by state 230 is forced to equal the sub-code generated in the offset code generation task, Vdac230 (same value indicated in Equation 15 above) represents the voltage equivalent of such forced code. Accordingly, the output (Vac_out230) of stage 230 is given by:

$$Vac\_out230 = G230(Vac\_out220 - Vdac230 + Voffset230) \qquad \text{Equation (20)}$$

wherein G230 represents the gain of stage 230 and Voffset230 represents the input offset of the amplifier within stage 230.

Similarly, the output of stage 240 is given by:

$$Vac\_out240 = G240\ (Vac\_out230 - Vdac240 + Voffset240) \qquad \text{Equation (21)}$$

wherein G240 represents the gain of stage 240, Vdac240 represents the voltage equivalent of the sub-code generated within stage 240, and Voffset240 represents the input offset of the amplifier within stage 240.

Thus, the sub-code generated by stage 250 corresponds to voltage Vout240. Substituting equation 19 into 20, and then 20 into 21, we obtain:

$$Vac\_out240 = \qquad \text{Equation (22)}$$
$$G240[(G230(Vref \times \epsilon 1 + Voffset220 \times G220 - Vdac230 + Voffset230)) - Vdac240 + Voffset240)$$

$$\begin{aligned} = [&(G240 \times G230 \times Vref \epsilon 1) + \\ &(G240 \times G230 \times G220 \times Voffset220) + \\ &(G240 \times G230 \times Voffset230) + (G240 \times Voffset240)] - \\ &G240 \times component3 - G240 \times component4 \end{aligned} \qquad \text{Equation (23)}$$

wherein component3=G230×Vdac230
and component4=Vdac240

The code generated by code generator 270 may represent an aggregate code corresponding to sub-code generated by stage 250, and the voltage Vac_out240 represents the aggregate level. The description is continued with reference to determining of code corresponding to capacitor mismatch.

8. Determining Capacitor Mismatch Code

The code corresponding to capacitor mismatch may be determined by subtracting offset code (of Equation 18) from that of aggregate code (Equation 23). The capacitor mismatch code corresponds to a difference voltage Vdiff generated by stage 240 while performing task 1 and task2. The difference voltage Vdiff is as shown by Equation (24) below.

$$Vdiff=\{[(G240\times G230\times Vref\ \epsilon 1)+$$
$$(G240\times G230\times G220\times Voffset220)+$$
$$(G240\times G230\times Voffset230)+$$
$$(G240\times Voffset240)]-G240\times$$
$$component3-G240\times component4\}-$$
$$\{[(G240\times G230\times G220\times Voffset220)+(G240\times G230\times Voffset230)+$$
$$(G240\times Voffset240)]-G240\times component1-G240\times$$
$$component2\} \qquad \text{Equation (24)}$$

$$Vdiff=(G240\times G230\times Vref\times \epsilon 1) \qquad \text{Equation (25)}$$

Thus, ε1 may be determined according to the following equation:

$$\epsilon 1 = Vdiff/(G230\times G240\times Vref) \qquad \text{Equation (26)}$$

Thus, by examining a difference of the signal levels at the input of stage 250 (e.g., the first stage in which the sub-codes are not forced to be equal), the mismatch level of each input capacitor may be determined. Once each ε1 value is determined, appropriate correction can be applied using various techniques, as will be apparent to one skilled in the relevant arts by reading the disclosure provided herein. In one embodiment, the n-bit digital code generated by code generator 270 is corrected according to the below equation.

$$\text{Corrected code=digital code+Digital equivalent of }((\epsilon 1+\epsilon 2+\ldots+\epsilon m)\times Vref) \qquad \text{Equation (27)}$$

wherein ε1 through εm represent the capacitor mismatch corresponding to the m input capacitors connected to Vref during φ2 while generating the digital code.

Alternatively, since the sub-code generated by each of stages 230 and 240 in the offset code generation task is equal to the corresponding sub-code generated in the aggregate code generation task, the difference of the digital codes generated during the two tasks also provides a measure of ε1. In such a case, ε1 may be computed according to the following equation:

$$\epsilon 1 = (\text{Aggregate code} - \text{Offset Code})/(G230\times G240) \qquad \text{Equation (28)}$$

Assuming correction is desired to be applied to the digital code directly, it is helpful to appreciate that the capacitor mismatch is amplified in each of the stages, and thus a variable βi may be computed as follows:

$$\beta 1 = \epsilon 1 \times (G230 \times G240) = (\text{Aggregate code} - \text{Offset Code}) \quad \text{Equation (29)}$$

All values of βi may be similarly computed. Thus, the corrected code may be generated according to the following Equation:

$$\text{Corrected code} = \text{Digital code} + (\beta 1 + \beta 2 + \beta 3 + \ldots + \beta m) \quad \text{Equation (30)}$$

In general, it is relatively important to correct for capacitor mismatches of the first stage since the effect of mismatches (in the first stage) gets amplified during subsequent stages. However, the capacitor mismatches in the later stages can also be measured by extending the approaches described above, and appropriate corrections performed. Such extensions will be apparent to one skilled in the relevant arts by reading the disclosure provided herein.

The capacitor mismatch code may thus be used to generate a corrected code. The description is continued with reference to implementation of ADC using some of the principles described above.

9. Correction to ADC

Figure 5:
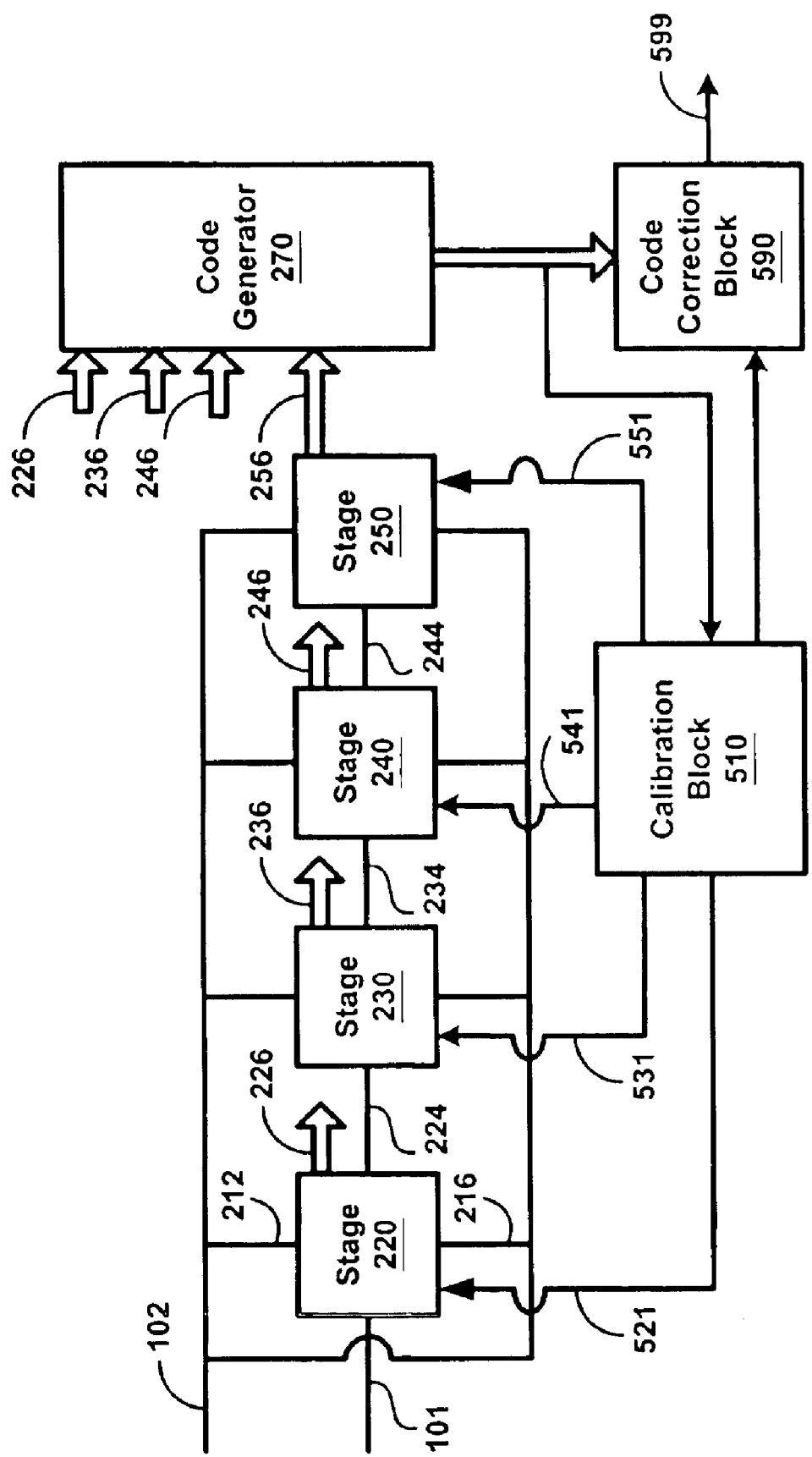
FIG. 5 is a block diagram illustrating the manner in which a calibration block can measure the capacitor mismatch of an ADC according to an aspect of the present invention.

FIG. 5 is a block diagram illustrating the manner in which the ADC of FIG. 2 can be extended to generate digital codes corrected for capacitor mismatch, in an embodiment of the present invention. The block diagram is shown containing calibration block 510, correction block 590, and all other blocks of FIG. 2. Only the modifications in FIG. 5 (as compared to FIG. 2) are described below for conciseness.

Code correction block 590 receives (from calibration block 510) mismatch codes (εi values described above) providing a measure of capacitor mismatch, and corrects each digital code generated by code generator 270. The correction may be performed according to Equations (27) or (30) noted above to generate a corrected code from each digital code. The corrected code is provided on path 599, as representing the voltage level of the sample received on path 101. Implementation of code generation block 590 will be apparent to one skilled in the relevant arts by reading the disclosure provide herein.

Calibration block 510 may control (connections to switches not shown) each of the switches during calibration phase, and determine the capacitor mismatches by examining the various digital codes generated by code generator 270. The theoretical basis for two example approaches, one ignoring any input offset of the amplifiers in the stages, and another taking into account the input offsets is described above. The operation of calibration block 510 making use of the two approaches is described below in further detail.

10. Methods

Figure 6:
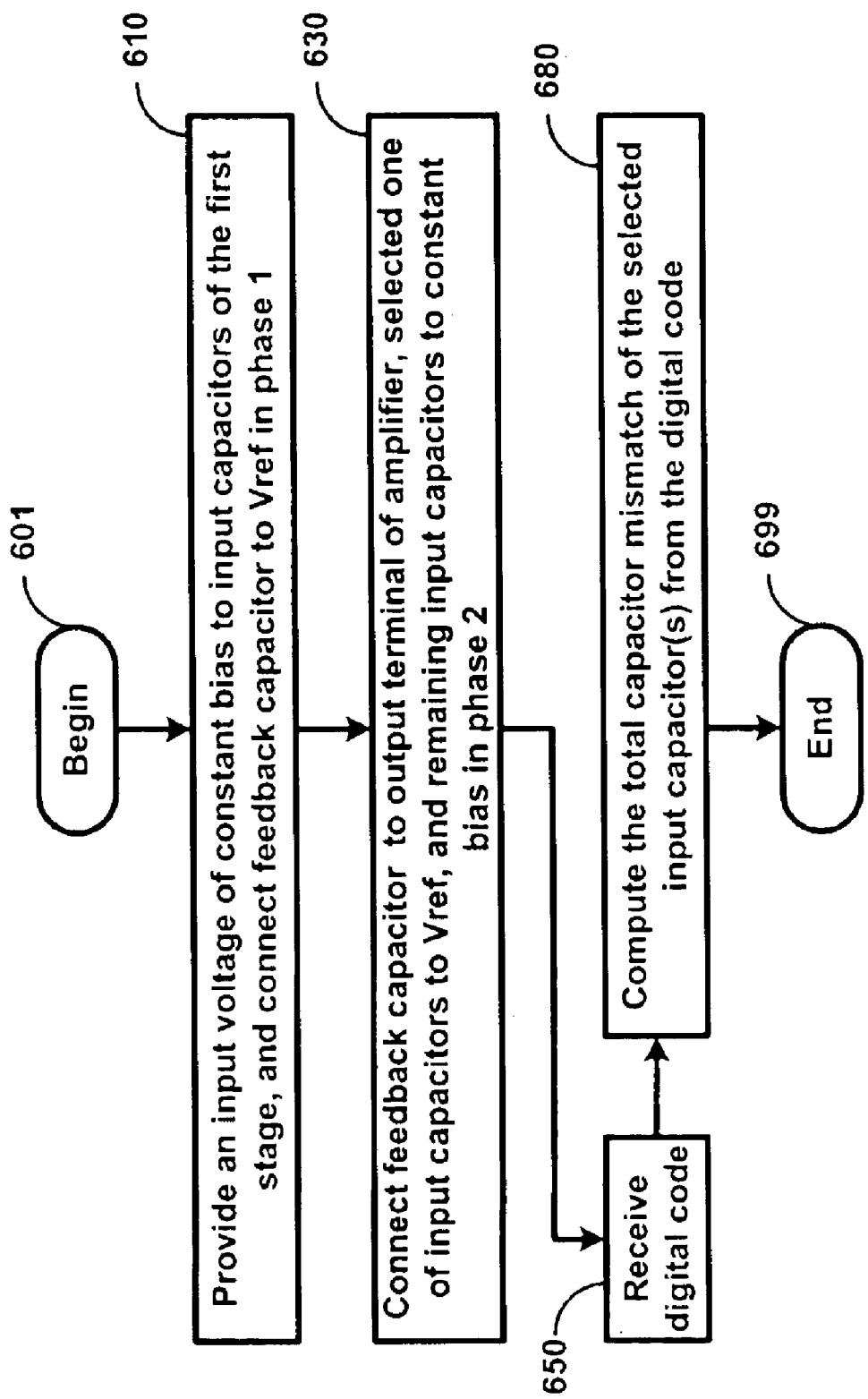
FIG. 6 is a flow-chart illustrating the manner in which capacitor mismatch may be determined assuming a zero input offset associated with the amplifiers in various stages of an ADC according to an aspect of the present invention.

FIG. 6 is a flowchart illustrating the manner in which ADC may be calibrated according to an aspect of the present invention. Flow-chart is described with reference to FIGS. 4 and 5 for illustration. The method begins in step 601, in which control immediately passes to step 610.

In step 610, calibration block 510 connects feedback capacitor 450 to reference voltage Vref in φ1 by closing switch 475-B, and provides constant bias voltage to input capacitors 430-1 through 430-8 by closing switches 425-A through 425-H. As a result Vin of 0 or common mode voltage is sampled onto the input capacitors, and feedback capacitor is charged to Vref.

In step 630, calibration block 510 connects feedback capacitor 450 to the output terminal of the amplifier, and selected ones of input capacitors 430-1 through 430-8 to reference voltage Vref. The remaining input capacitors are connected to common mode voltage 460 (fixed bias voltage). For illustration, assuming that the capacitor mismatch of only input capacitor 430-1 is to be determined, switches 420-A and 425-B through 425-H are closed (and switches 425-A and 420-B through 420-H are left open). Switch 485 is closed to provide the feedback loop and switch 475-B is closed to sample Vref on feedback capacitor 450.

If there is no capacitor mismatch, the output of amplifier 490 equals 0. In general, the output voltage generated by amplifier 490 would be proportionate to the extent of capacitor mismatch. In step 650, calibration block 510 receives a digital code from code generator 270.

In step 680, calibration block 510 computes the total capacitor mismatch (e.g., sum of εi) of the input capacitors selected in step 630. Equation 13 may be used for the computation. The method then ends in step 699. The description is continued with respect to a method which considers the input offset of amplifiers in determining the capacitor mismatch.

Figure 7:
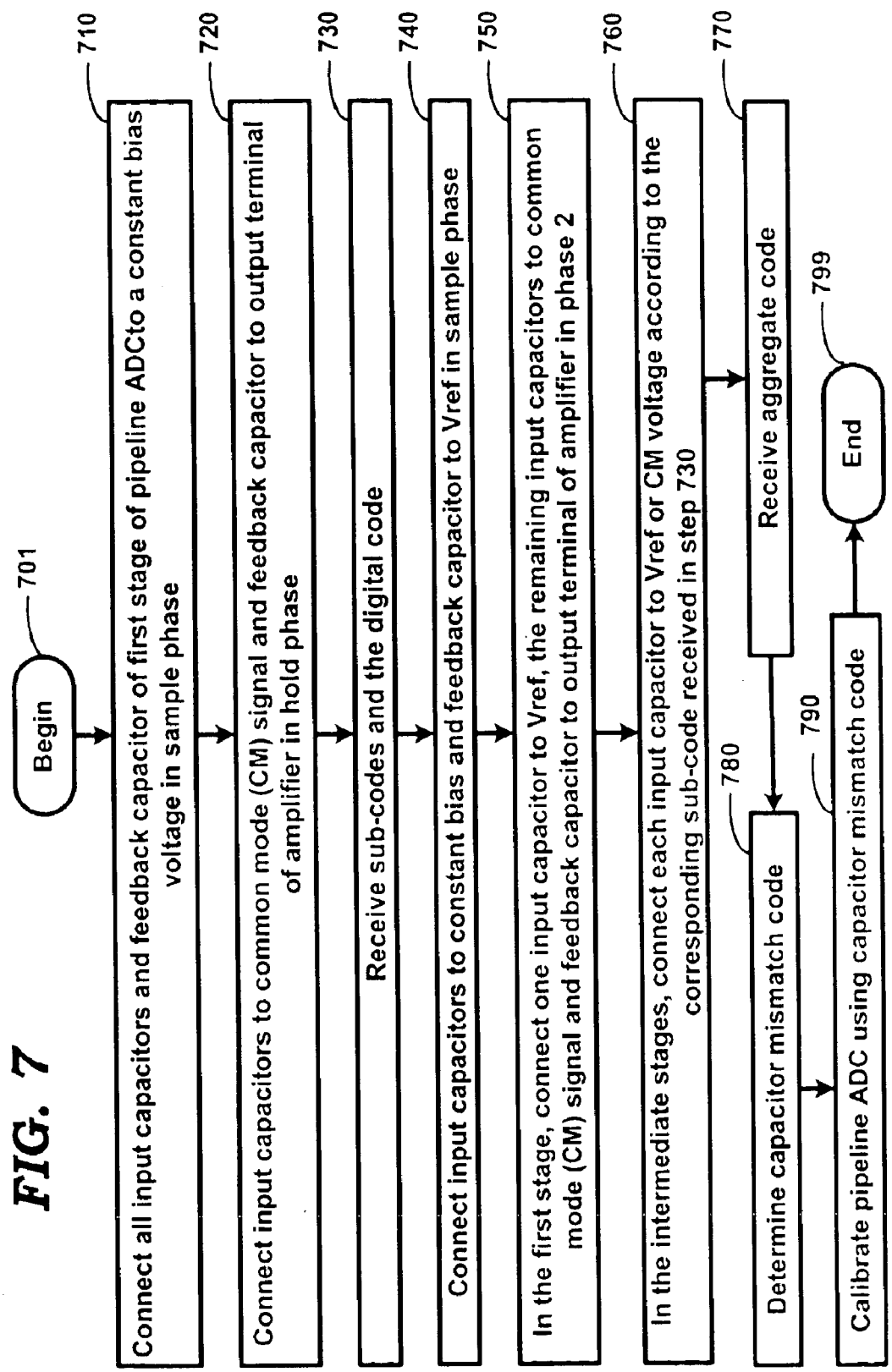
FIG. 7 is a flow-chart illustrating the manner in which capacitor mismatch may be determined assuming a non-zero input offset associated with amplifiers in various stages of an ADC according to an aspect of the present invention.

FIG. 7 is a flow-chart illustrating the manner in which capacitor mismatch may be measured considering the (non-zero) input offset of amplifiers according to an aspect of the present invention. The flow-chart is described with reference to FIGS. 5 and 4 (representing stage 220) for illustration. However, capacitor mismatch may be computed in other environments as well without deviating from the scope and spirit of various aspects of the present invention. The method begins in step 701, in which control immediately passes to step 710.

In step 710, calibration block 510 connects all input capacitors 430-1 through 430-8 and feedback capacitor 450 to common mode (CM) signal in φ1 by closing switches 410-A through 410-H, 465 and 475-A. As a result, a 0 voltage is sampled onto the input capacitors and the feedback capacitor. Thus, the voltage at node 495 should ideally equal 0 at the end of φ1.

In step 720, calibration block 510 connects all input capacitors 430-1 through 430-8 to common mode (CM) signal 460, and feedback capacitor 450 to output terminal of operational amplifier 490 in φ2 by closing switches 410-A through 410-H, 465 and 485. As a result, the voltage at node 495 is amplified and provided as the output of amplifier 490.

In addition, the offset voltage of amplifier 490 is also amplified and provided on the out output of amplifier 490. The corresponding component is further processed (including amplification and conversion to sub-codes) in subsequent stages 230, 240 and 250. Code generator 270 generates the corresponding N-bit digital code.

In step 730, calibration block 510 receives the digital code, representing the offset code described in further detail in sections above. In addition, calibration block 51 receives each of the sub-codes generated by intermediate stages 230 and 240. The sub-codes are used to generate Vdac voltages for the corresponding stages, in steps below.

In step 740, calibration block 510 connects all input capacitors 430-1 through 430-H to common mode (CM) signal 460 and feedback capacitor 450 to Vref in φ1 by closing 410-A through 410-H, 465, and 475-B (in first stage 220). As a result the input capacitors sample common mode voltage and feedback capacitor samples Vref.

In step 750, one of the input capacitors (e.g., 430-1 or multiple ones, as with FIG. 6) may be connected (by calibration block 510) to Vref by closing a corresponding switch (420-A), the remaining input capacitors (430-2 through 430-8) to common mode (CM) signal 460 by closing switches 410-B through 410-H, and feedback capacitor 450 to the output terminal of operational amplifier 490 by closing switch 485.

Ideally, the output of amplifier 490 should be zero. However, non-zero voltage would be present both due to capacitor mismatch and input offset. The aggregate error voltage generated at the output terminal of operational amplifier 490 (first stage 220) equals sum of offset error voltage and mismatch error voltage (due to mismatch of 430-1 and 450) amplified by the gain of amplifier.

In step 760, calibration block 510 connects the sampling capacitors of each of the intermediate stages to either Vref or common mode voltage according to the value of the corresponding sub-code received in step 730 in the hold phase φ2. That is, the same number of capacitors are connected to Vref (or common mode voltage) in the hold phase (conveniently referred to as the second phase) while determining the offset code as well as the aggregate code.

In step 770, calibration block 510 receives the digital code, representing the aggregate code noted above. In step 780, the mismatch code corresponding to capacitor mismatch may be computed as described in sections above. Control then passes to step 799 in which the method ends.

The capacitor mismatch thus measured may then be used to correct the digital code generated by code generator 270. Thus, an ADC may be calibrated according to an aspect of the present invention. The description is continued with reference to an example device in which several features of the present invention may be implemented.

11. Example Device

Figure 8:
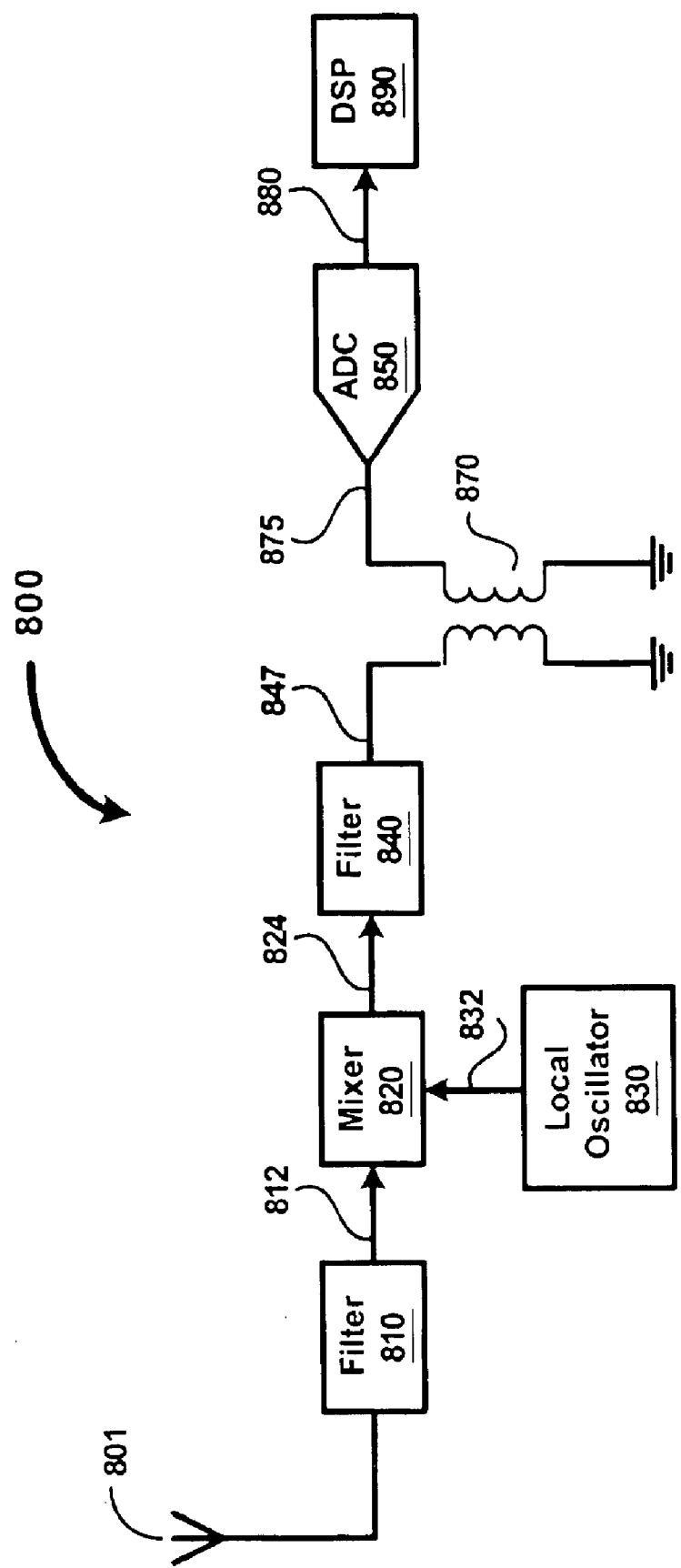
FIG. 8 is a block diagram of an example device in which the present invention can be implemented.

FIG. 8 is a block diagram of wireless base station system 800 illustrating an example system in which the present invention may be implemented. For illustration, it is assumed that wireless base station system 800 is implemented to transfer signals corresponding to mobile phone, etc. However, various aspects of the present invention can be implemented in other communication systems (e.g., data processing systems, etc.).

Wireless base station system 800 is shown containing antenna 801, filters 810 and 840, mixer 820, local oscillator 830, analog to digital converter (ADC) 850, transformer 870, transmission line 880, and digital signal processor (DSP) 890. Each component is described in further detail below.

Antenna 801 may receive various signals transmitted from mobile phones, other wireless base stations, etc. The received signals may be provided to filter 810. Filter 810 may perform a corresponding transfer function to generate signals of the frequencies of interest. The generated signals are provided on path 812 to mixer 820. Antenna 801 and filter 810 may be implemented in a known way.

Local oscillator 830 generates a signal with a fixed frequency and provides the fixed frequency signal on path 832. In an embodiment, the signal (on path 832) of fixed frequency may be generated by a phase locked loop, crystal, etc. in a known way.

Mixer 820 may be used to convert a high frequency signal to a signal having any desired frequency. In an embodiment, a signal of frequency 1575 MHz is converted to a 4 Mhz signal. Mixer 820 receives filtered signal on path 812 and a signal of fixed frequency on path 832 as inputs and provides the signal with a desired frequency on path 824.

Filter 840 filters the signal received on path 824 to remove any noise components that may be present. In general, a mixer generates noise and the output of mixer contains various noise components including the signal with desired frequency. Filter 840 provides the signal with desired frequency only on path 847. Mixer 820, local oscillator 830, and filter 440 may also be implemented in a known way.

Transformer 870 amplifies the signal received on path 847 to generate an amplified signal. The amplified signal may be provided to analog to digital converter (ADC) 850 on path 875.

ADC 850 converts the analog signal received on path 875 to a corresponding digital code by calibrating ADC 850 as described above. The digital code may be provided to DSP 890 through transmission line 880. DSP 890 (example of a processing block) receives the digital code to provide various user applications (such as telephone calls, data applications). ADC 850 may be implemented using the approaches described above.

Thus, various aspects of the present invention described above can be used to calibrate an ADC to generate a digital code which represents an input analog signal potentially accurately.

12. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of measuring capacitor mismatch in an analog to digital converter (ADC), said ADC converting an analog signal to a plurality of digital codes, said ADC containing a plurality of stages and a code generator, said plurality of stages being connected in sequence, a first stage contained in said plurality of stages comprising a sub_ADC, a plurality of input capacitors, an amplifier and a feedback capacitor, said sub_ADC generating a sub_code from which said code generator generates each of said plurality of digital codes, said method comprising:

sampling a first voltage on each of said plurality of input capacitors in a first phase, wherein said first voltage is designed to cause at least some of said plurality of stages to generate a sub_code equaling zero;

charging said feedback capacitor to a second voltage, wherein said second voltage is not equal to said first voltage;

connecting one of said plurality of input capacitors to said second voltage in a second phase;

connecting said feedback capacitor across said amplifier in said second phase; and determining a capacitor mismatch of said one of said plurality of input capacitors by examining a first signal generated by said second phase.

2. The method of claim 1, wherein said first voltage comprises a constant bias voltage and said second voltage comprising a reference voltage (Vref).

3. The method of claim 2, wherein said first signal comprises a digital code generated by said code generator.

4. The method of claim 3, wherein said digital code is divided by a result of multiplication of a gain of said plurality of stages.

5. The method of claim 2, wherein the steps of claim 1 are performed in one clock cycle, said method further comprising performing the following in an earlier clock cycle, wherein said earlier clock cycle precedes said one clock cycle:

connecting all of said plurality of input capacitors and said feedback capacitor to a constant bias voltage in a first phase of said earlier clock cycle;

connecting all of said plurality of input capacitors to a constant bias voltage in a second phase of said earlier clock cycle;

connecting said feedback capacitor across said amplifier in said second phase of said earlier clock cycle; and generating and examining a second signal to determine an input offset presented by said plurality of stages, wherein said capacitor mismatch is determined based on said second signal and said first signal.

6. The method of claim 5, receiving said sub-code from an intermediate stage contained in said plurality of stages, said method further comprising:

in said second phase of said one clock cycle, connecting each of a plurality of capacitors in said intermediate stage to either Vref or said constant bias voltage according to said sub-code.

7. The method of claim 6, wherein said second signal comprises a second digital code generated by said code generator, wherein said first signal comprises a first digital code generated by said code generator, wherein said capacitor mismatch is computed by subtracting said first digital code from said second digital code.

8. The method of claim 6, wherein each of said first signal and said second signal comprises an input signal provided to a last stage contained in said plurality of stages in a respective one of said early clock cycle and said one clock cycle, wherein said capacitor mismatch is computed based on a difference of voltage levels of said second signal and said first signal.

9. The method of claim 1, wherein said sampling comprises providing an INP voltage equaling an INM voltage in a differential operation, wherein a difference between said INP voltage and said INM voltage represents said first voltage.

10. An electrical circuit accurately generating a plurality of corrected codes from an analog signal, wherein said plurality of corrected codes accurately represent respective voltage levels of said analog signal, said electrical circuit comprising:

an analog to digital converter (ADC) containing a plurality of stages including a first stage, said ADC comprising:

a first stage receiving said analog signal, said first stage comprising:
a plurality of input capacitors;
an amplifier;
a feedback capacitor;
a first plurality of input switches, each of said first plurality of input switches being operable to connect a corresponding one of said plurality of input capacitors to said input signal;
a second plurality of input switches, each of said second plurality of input switches being operable to connect a corresponding one of said plurality of input capacitors to a first voltage, wherein said first voltage is designed to cause at least some of said plurality of stages to generate a sub-code equaling zero;
a third plurality of input switches, each of said third plurality of input switches being operable to connect a corresponding one of said plurality of input capacitors to a second voltage;
a fourth switch operable to connect an output terminal of said amplifier to said feedback capacitor;
a fifth switch operable to connect said feedback capacitor to said first voltage; and
a sixth switch operable to connect said feedback capacitor to said second voltage; and a code generator block receiving each of a plurality of sub-codes from corresponding ones of said plurality of stages, and generating a digital code output; and a calibration block controlling the operation of said first plurality of input switches, said second plurality of input switches, said third plurality of input switches, said fourth switch, said fifth switch and said sixth switch to determine a capacitor mismatch of at least one of said plurality of input capacitors.

11. The electrical circuit of claim 10, wherein said code generator block is operable to:

close said second plurality of switches to sample said first voltage on each of said input capacitors in a first phase;

close said sixth switch to charge said feedback capacitor to said second voltage;

close one of said third plurality of input switches to connect one of said plurality of input capacitors to said second voltage in a second phase; and close said fourth switch to connect said feedback amplifier across said feedback amplifier in said second phase, wherein said calibration block determines a capacitor mismatch of said one of said plurality of input capacitors by examining a first signal generated by said second phase.

12. The electrical circuit of claim 11, wherein said first voltage comprises a constant bias voltage and said second voltage comprising a reference voltage (Vref) used by said ADC.

13. The electrical circuit of claim 12, further comprising a correction block correcting said digital code output based on said capacitor mismatch to generate one of said plurality of corrected codes.

14. The electrical circuit of claim 13, wherein said first signal comprises a digital code generated by said code generator.

15. The electrical circuit of claim 14, wherein said digital code output is divided by a result of multiplication of a gain of said plurality of stages.

16. The electrical circuit of claim 12, wherein the elements of claim 11 are operable in one clock cycle, said calibration block being further operable as follows in an earlier clock cycle, wherein said earlier clock cycle precedes said one clock cycle:

close said second plurality of switches and said fifth capacitor to connect all of said plurality of input capacitors and said feedback capacitor to said constant bias voltage in a first phase of said earlier clock cycle;

close said second plurality of switches to connect all of said plurality of input capacitors to said constant bias voltage in a second phase of said earlier clock cycle;

close said fourth switch to connect said feedback capacitor across said amplifier in said second phase of said earlier clock cycle; and generate and examine a second signal to determine an input offset presented by said plurality of stages, wherein said capacitor mismatch is determined based on said second signal and said first signal.

17. The electrical circuit of claim 16, wherein said calibration block is further operable to:

receive a sub-code from an intermediate stage contained in said plurality of stages;

in said second phase of said one clock cycle, connect each of a plurality of capacitors in said intermediate stage to either a reference voltage (Vref) or said constant bias voltage according to said sub-code.

18. The electrical circuit of claim 17, wherein said second signal comprises a second digital code generated by said code generator, wherein said first signal comprises a first digital code generated by said code generator, wherein said capacitor mismatch is computed by subtracting said first digital code from said second digital code.

19. The electrical circuit of claim 17, wherein said correction block correcting said digital code output by adding (said second digital code—said first digital code) to said digital code output.

20. The electrical circuit of claim 17, wherein each of said first signal and said second signal comprises an input signal provided to a last stage contained in said plurality of stages in a respective one of said early clock cycle and said one clock cycle, wherein said capacitor mismatch is computed based on a difference of voltage levels of said second signal and said first signal.

21. The electrical circuit of claim 10, wherein said sampling comprises providing an INP voltage equaling an INM voltage in a differential operation, wherein a difference between said INP voltage and said INM voltage represents said first voltage.

22. An apparatus generating a plurality of corrected codes accurately representing the voltage levels on an analog signal, said apparatus comprising:

an analog to digital converter (ADC) converting said analog signal to a plurality of digital codes, said ADC containing a plurality of stages and a code generator, said plurality of stages being connected in sequence, a first stage contained in said plurality of stages containing a sub-ADC, a plurality of input capacitors, an amplifier and a feedback amplifier, said sub-ADC generating a sub-code from which said code generator generates each of said plurality of digital codes;

means for sampling a first voltage on each of said plurality of input capacitors in a first phase, wherein said first voltage is designed to cause at least some of said plurality of stages to generate a sub_code equaling zero;

means for charging said feedback capacitor to a second voltage, wherein said second voltage is not equal to said first voltage;

means for connecting one of said plurality of input capacitors to said second voltage in a second phase;

means for connecting said feedback capacitor across said amplifier in said second phase; and means for determining a capacitor mismatch of said one of said plurality of input capacitors by examining a first signal generated by said second phase.

23. The apparatus of claim 22, wherein said first voltage comprises a constant bias voltage and said second voltage comprising a reference voltage (Vref).

24. The apparatus of claim 23, wherein said first signal comprises a digital code generated by said code generator.

25. The apparatus of claim 24, wherein said digital code is divided by a result of multiplication of a gain of said plurality of stages.

26. The apparatus of claim 23, wherein the elements of claim 1 are operated in one clock cycle, said apparatus further comprising the following to operate in an earlier clock cycle, wherein said earlier clock cycle precedes said one clock cycle;

means for connecting all of said plurality of input capacitors and said feedback capacitor to a constant bias voltage in a first phase of said earlier clock cycle;

means for connecting all of said plurality of input capacitors to a constant bias voltage in a second phase of said earlier clock cycle;

means for connecting said feedback capacitor across said amplifier in said second phase of said earlier clock cycle; and means for generating and examining a second signal to determine an input offset presented by said plurality of stages, wherein said capacitor mismatch is determined based on said second signal and said first signal.

27. The apparatus of claim 26, further comprising:

means for receiving a sub-code from an intermediate stage contained in said plurality of stages;

in said second phase of said one clock cycle, connecting each of a plurality of capacitors in said intermediate stage to either said Vref or said constant bias voltage according to said sub-code.

28. The apparatus of claim 27, wherein said second signal comprises a second digital code generated by said code generator, wherein said first signal comprises a first digital code generated by said code generator, wherein said capacitor mismatch is computed by subtracting said first digital code from said second digital code.

29. The apparatus of claim 27, further comprises means for correcting to add (said second digital code—said first digital code) to each of said plurality of digital codes generated by said ADC.

30. The apparatus of claim 27, wherein each of said first signal and said second signal comprises an input signal provided to a last stage contained in said plurality of stages in a respective one of said early clock cycle and said one clock cycle, wherein said capacitor mismatch is computed based on a difference of voltage levels of said second signal and said first signal.

31. The apparatus of claim 23, wherein said sampling comprises providing an INP voltage equaling an INM voltage in a differential operation, wherein a difference between said INP voltage and said INM voltage represents said first voltage.

32. A device processing an analog signal, said device comprising:

an analog to digital converter (ADC) containing a plurality of stages including a first stage, said ADC comprising:

a first stage receiving said analog signal, said first stage comprising:

a plurality of input capacitors;

an amplifier;

a feedback capacitor;

a first plurality of input switches, each of said first plurality of input switches being operable to connect a corresponding one of said plurality of input capacitors to said input signal;

a second plurality of input switches, each of said second plurality of input switches being operable to connect a corresponding one of said plurality of input capacitors to a first voltage, wherein said first voltage is designed to cause at least some of said plurality of stages to generate a sub_code equaling zero;

a third plurality of input switches, each of said third plurality of input switches being operable to connect a corresponding one of said plurality of input capacitors to a second voltage;

a fourth switch operable to connect an output terminal of said amplifier to said feedback capacitor;

a fifth switch operable to connect said feedback amplifier to said first voltage; and a sixth switch operable to connect said feedback amplifier to said second voltage; and a code generator block receiving each of a plurality of sub-codes from corresponding ones of said plurality of stages, and generating an uncorrected code; and a calibration block controlling the operation of said first plurality of input switches, said second plurality of input switches, said third plurality of input switches, said fourth switch, said fifth switch and said sixth switch to determine a capacitor mismatch of at least one of said plurality of input capacitors.

33. The device of claim 32, wherein said code generator block is operable to:

close said second plurality of switches to sample said first voltage on each of said input capacitors in a first phase;

close said sixth switch to charge said feedback amplifier to said second voltage in said first phase;

close one of said third plurality of input switches to connect one of said plurality of input capacitors to said second voltage in a second phase; and close said fourth switch to connect said feedback amplifier across said feedback amplifier in said second phase, wherein said calibration block determines a capacitor mismatch of said one of said plurality of input capacitors by examining a first signal generated by said second phase.

34. The device of claim 33, wherein said first voltage comprises a constant bias voltage and said second voltage comprising a reference voltage (Vref) used by said ADC.

35. The device of claim 34, further comprising a correction block correcting said uncorrected code based on said capacitor mismatch to generate one of said plurality of digital codes.

36. The device of claim 35, wherein said first signal comprises a digital code generated by said code generator.

37. The device of claim 36, wherein said digital code is divided by a result of multiplication of a gain of said plurality of stages.

38. The device of claim 34, wherein the elements of claim 11 are operable in one clock cycle, said calibration block being further operable as follows in an earlier clock cycle, wherein said earlier clock cycle precedes said one clock cycle:

close said second plurality of switches and said fifth capacitor to connect all of said plurality of input capacitors and said feedback capacitor to said constant bias voltage in a first phase of said earlier clock cycle;

close said second plurality of switches to connect all of said plurality of input capacitors to said constant bias voltage in a second phase of said earlier clock cycle;

close said fourth switch to connect said feedback capacitor across said amplifier in said second phase of said earlier clock cycle; and generate and examine a second signal to determine an input offset presented by said plurality of stages, wherein said capacitor mismatch is determined based on said second signal and said first signal.

39. The device of claim 38, wherein said calibration block is further operable to:

receive a sub-code from an intermediate stage contained in said plurality of stages;

in said second phase of said one clock cycle, connect each of a plurality of capacitors in said intermediate stage to either a reference voltage (Vref) or said constant bias voltage according to said sub-code.

40. The device of claim 39, wherein said second signal comprises a second digital code generated by said code generator, wherein said first signal comprises a first digital code generated by said code generator, wherein said capacitor mismatch is computed by subtracting said first digital code from said second digital code.

41. The device of claim 39, wherein each of said first signal and said second signal comprises an input signal provided to a last stage contained in said plurality of stages in a respective one of said early dock cycle and said one clock cycle, wherein said capacitor mismatch is computed based on a difference of voltage levels of said second signal and said first signal.

42. The device of claim 32, wherein an INP voltage equaling an INM voltage is provided in a differential operation, wherein a difference between said INP voltage and said INM voltage represents said first voltage.

43. The device of claim 32, wherein said device comprises a wireless base station.

* * * * *